(12) United States Patent
Kawano

(10) Patent No.: US 9,431,362 B2
(45) Date of Patent: Aug. 30, 2016

(54) SEMICONDUCTOR MODULE

(71) Applicant: FUJITSU LIMITED, Kawasaki-shi, Kanagawa (JP)

(72) Inventor: Yoichi Kawano, Setagaya (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/566,784

(22) Filed: Dec. 11, 2014

(65) Prior Publication Data

US 2015/0214174 A1    Jul. 30, 2015

(30) Foreign Application Priority Data

Jan. 27, 2014   (JP) .................................. 2014-012331

(51) Int. Cl.
| | | |
|---|---|---|
| *H01L 23/00* | (2006.01) | |
| *H01L 23/528* | (2006.01) | |
| *H01L 23/66* | (2006.01) | |
| *H01L 23/522* | (2006.01) | |

(52) U.S. Cl.
CPC ........... *H01L 24/17* (2013.01); *H01L 23/5223* (2013.01); *H01L 23/5286* (2013.01); *H01L 23/66* (2013.01); *H01L 24/16* (2013.01); *H01L 2223/6627* (2013.01); *H01L 2223/6655* (2013.01); *H01L 2224/0401* (2013.01); *H01L 2224/16145* (2013.01); *H01L 2224/16227* (2013.01); *H01L 2224/48091* (2013.01); *H01L 2224/48227* (2013.01); *H01L 2924/00014* (2013.01); *H01L 2924/30105* (2013.01); *H01L 2924/30107* (2013.01)

(58) Field of Classification Search
USPC ........................................................ 257/778
See application file for complete search history.

(56) References Cited

U.S. PATENT DOCUMENTS

| 5,248,903 A   * | 9/1993 | Heim .................. G03F 7/70433 |
| | | 257/748 |
| 2003/0042993 A1* | 3/2003 | Sayanagi ................ H01L 23/66 |
| | | 333/26 |
| 2013/0049654 A1* | 2/2013 | Kure ....................... B60L 3/003 |
| | | 318/400.2 |
| 2014/0147128 A1* | 5/2014 | Han ..................... H05K 1/0251 |
| | | 398/135 |

FOREIGN PATENT DOCUMENTS

JP            2012-175438            9/2012

* cited by examiner

*Primary Examiner* — Zandra Smith
*Assistant Examiner* — Lawrence Tynes, Jr.
(74) *Attorney, Agent, or Firm* — Fujitsu Patent Center

(57) ABSTRACT

A semiconductor module includes a first semiconductor chip including a first signal line and a first ground, a mounting board or a second semiconductor chip including a second signal line and a second ground, a signal line coupling bump that couples the first signal line and the second signal line with each other, a first ground coupling bump that couples the first ground and the second ground with each other, a signal line side insulating film including a capacitance that causes a series resonance with an inductance by the signal line coupling bump at a target frequency and a ground side insulating film including a capacitance that causes a series resonance with an inductance by the first ground coupling bump at a target frequency.

6 Claims, 10 Drawing Sheets

SEMICONDUCTOR MODULE

CROSS-REFERENCE TO RELATED APPLICATION

This application is based upon and claims the benefit of priority of the prior Japanese Patent Application NO. 2014-012331, filed on Jan. 27, 2014, the entire contents of which are incorporated herein by reference.

FIELD

The embodiments discussed herein are related to a semiconductor module.

BACKGROUND

In recent years, the transmission speed of wireless communication equipment is steadily increasing. It is considered that one of causes of the increase is that data communication such as Web reading, downloading of music and so forth using a terminal represented by the Smartphone has become the mainstream from traditional voice communication. In the future, it is expected that such an application as may download a large-capacity video such as a movie in an instant is implemented.

Conventionally, in a semiconductor module provided in wireless communication equipment for which a microwaveband of approximately 300 MHz to approximately 3 GHz is used, wire bonding mounting is used in which a semiconductor chip is mounted face-up on a mounting board such as, for example, a PCB (Printed Circuit Board) and the signal line and the signal line, the ground and the ground (GND) and so forth are coupled with each other using a wire as depicted, for example, in FIG. 6.

However, if it is tried to apply such a chip mounting method as just described to a semiconductor module provided in wireless communication equipment for which, for example, a millimeter waveband equal to or higher than approximately 30 GHz is used, then it is difficult to transmit a high-frequency signal (RF signal) because of an inductance originating from the length of the wire.

Therefore, in a semiconductor module provided in wireless communication equipment for which, for example, the millimeter waveband equal to or higher than approximately 30 GHz is used, for example, as depicted in FIG. 7, flip chip mounting is used in which a semiconductor chip is mounted face-down in a reversed relationship on a mounting board such as, for example, a PCB and the signal line and the signal line, the ground and the ground and so forth are coupled with each other using a bump (ball bump) having a shorter electric length than that of the wire. For example, in a semiconductor module for high-speed wireless communication (high-speed wireless communication chip) that utilizes an approximately 60 GHz band or a semiconductor module for an automobile radar (automobile radar chip) that utilizes an approximately 77 GHz band, a high-frequency signal can be transmitted without any problem only if the components are coupled using a bump.

SUMMARY

According to an aspect of the embodiment, a semiconductor module includes a first semiconductor chip including a first signal line and a first ground, amounting board or a second semiconductor chip including a second signal line and a second ground, a signal line coupling bump that couples the first signal line and the second signal line with each other, a first ground coupling bump that couples the first ground and the second ground with each other, a signal line side insulating film including a capacitance that causes a series resonance with an inductance by the signal line coupling bump at a target frequency and a ground side insulating film including a capacitance that causes a series resonance with an inductance by the first ground coupling bump at a target frequency.

The object and advantages of the disclosure will be realized and attained by means of the elements and combinations particularly pointed out in the claims.

It is to be understood that both the foregoing general description and the following detailed description are exemplary and explanatory and are not restrictive of the disclosure.

BRIEF DESCRIPTION OF DRAWINGS

FIGS. 8A and 8B are schematic views depicting a configuration of the semiconductor module flip-chip mounted only by a bump, wherein FIG. 8A is a sectional view and FIG. 8B is a top plan view;

DESCRIPTION OF EMBODIMENTS

Incidentally, since the transmission speed of wireless communication equipment is steadily increasing as described above, it is expected to implement wireless communication equipment for which a sub millimeter waveband higher than approximately 300 GHz is used.

In particular, the sub millimeter waveband of approximately 300 GHz to approximately 3 THz can be used in a very wide frequency bandwidth in comparison with a lower frequency band (for example, a band of approximately 10 GHz or less) than the sub millimeter waveband and the transmission speed can be increased as much. Therefore, it is expected to increase the transmission speed of wireless communication equipment by implementing the wireless communication equipment for which a sub millimeter waveband is used.

In this case, it has been found that, if a chip mounting method applied to a semiconductor module provided in the wireless communication equipment for which the millimeter waveband described above is used is used for a semiconductor module to be provided in the wireless communication equipment for which the sub millimeter waveband of approximately 300 GHz or more is used, then it is difficult to transmit a high frequency signal.

In particular, it has been found that, in the semiconductor module to be provided in the wireless communication equipment for which the sub millimeter waveband of approximately 300 GHz or more is used, an inductance (for example, several 10 pH) arising from a diameter of a bump cannot be ignored anymore and it is difficult to transmit a high frequency signal.

Figure 8A:
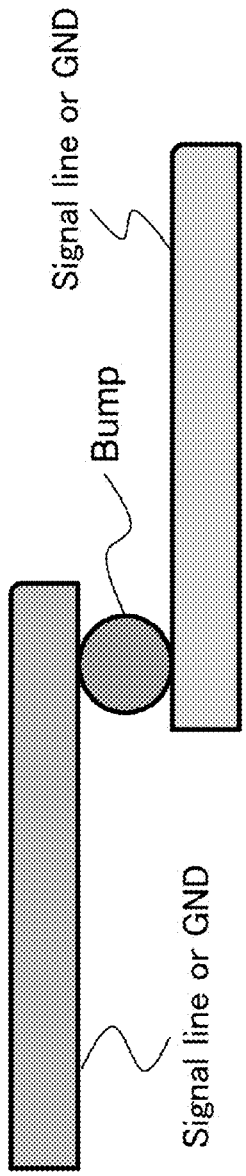
Figure 8B:
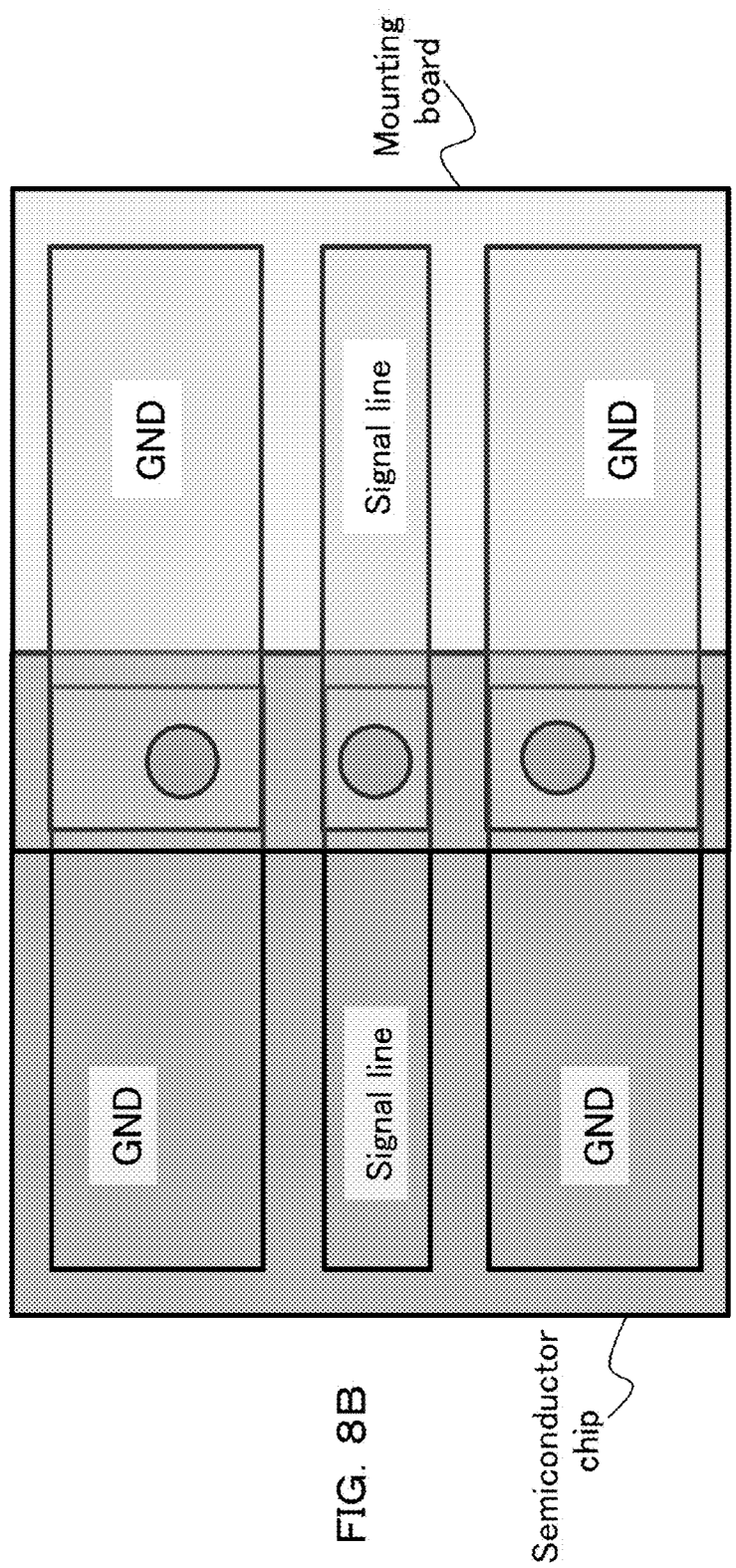
Figure 9:
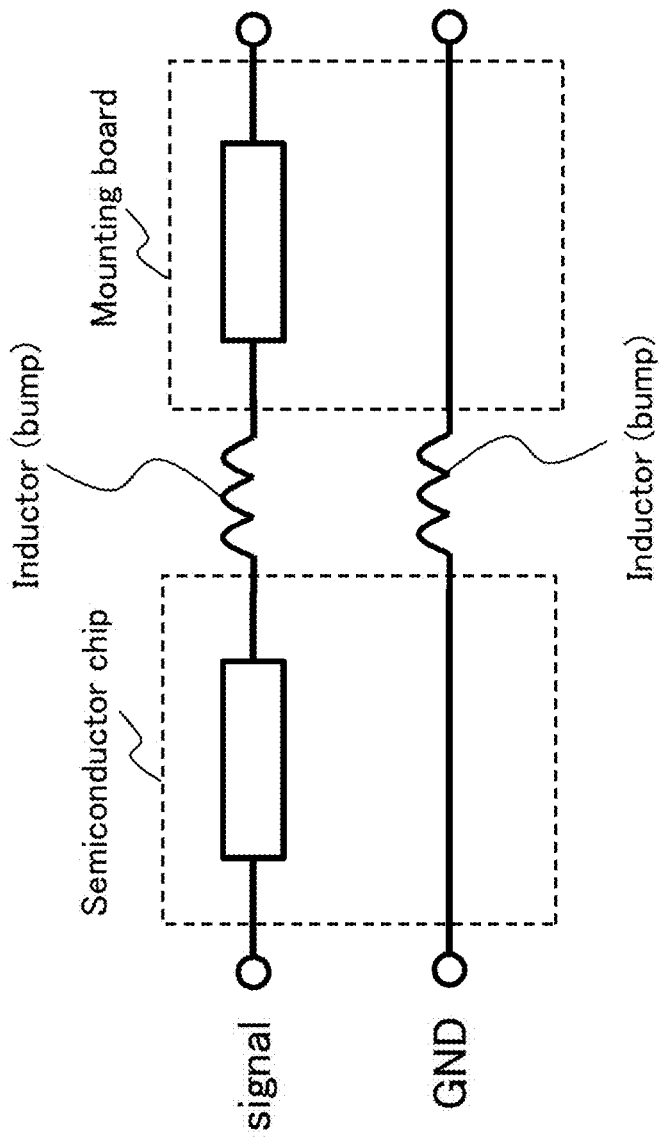
FIG. 9 is a view depicting an equivalent circuit of the semiconductor module flip-chip mounted only by a bump.
Figure 10:
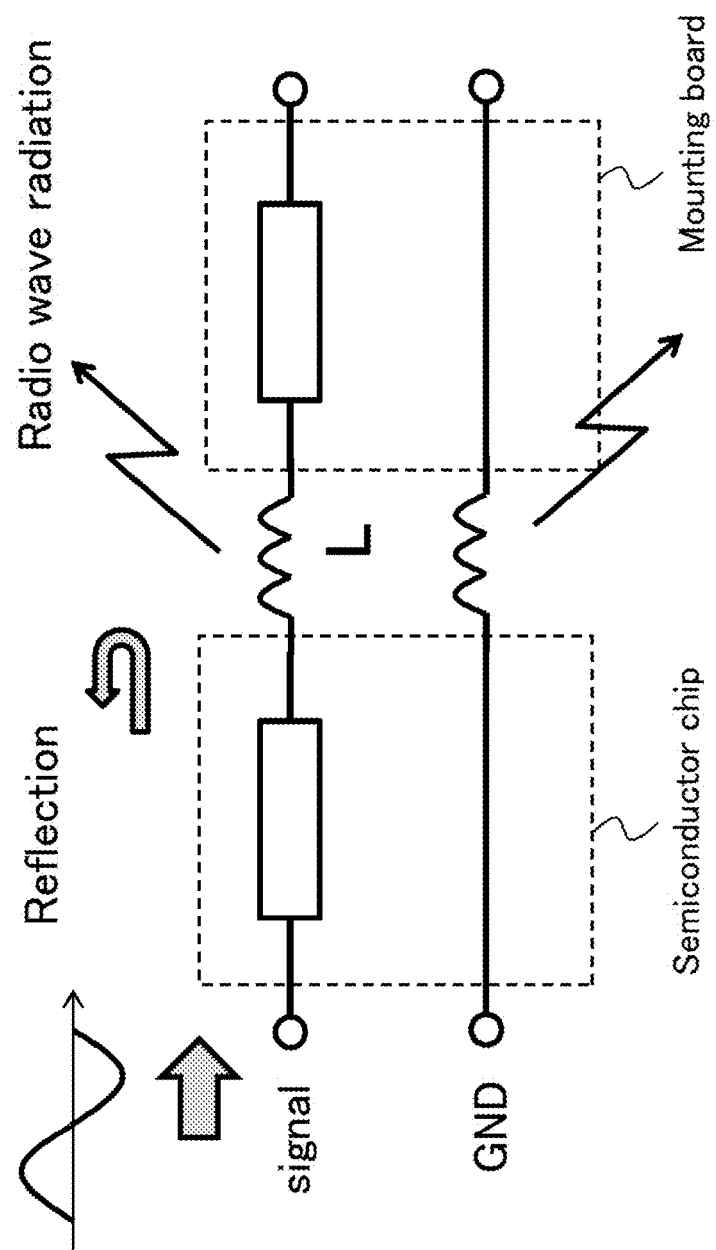
FIG. 10 is a view illustrating a subject of the semiconductor module flip-chip mounted only by a bump.

For example, in such a semiconductor module as just described, a signal line and a signal line, and a ground and a ground, are individually coupled with each other using a bump having, for example, a diameter of approximately 50 µm, for example, as depicted in FIGS. 8A and 8B. It is to be noted that, as depicted in FIG. 8A, the signal line and the signal line, and the ground and the ground are individually coupled with each other through a bump similarly to each other. In this case, for example, as depicted in an equivalent circuit diagram of FIG. 9, the signal line and the signal line, and the ground and the ground are individually coupled with each other through an inductor parasitic to a bump. Here, in the sub millimeter waveband that reaches several hundred GHz, even a very low parasitic inductor has a high impedance determined by $Z=\omega L$ (here, $\omega=2\pi f$). For example, if the inductance is approximately 50 pH, then an inductor parasitic to a bump has an impedance of approximately 100Ω at the frequency of approximately 300 GHz. Further, if the frequency increases and the impedance by the inductance of the bump increases, then the bump cannot be considered as a short circuit any more. Further, as depicted in FIG. 10, a signal is reflected or is radiated to a space (electromagnetic radiation) thereby to increase the loss, and it is difficult to transmit a high frequency signal. In this manner, the inductance of the inductor parasitic to the bump cannot be ignored and it is difficult to transmit a high frequency signal.

Therefore, it is desired to suppress increase of the impedance arising from the inductance of a bump where the signal line and the signal line or the ground and the ground are coupled with each other using a bump thereby increase of the loss, and to make it possible to transmit a high frequency signal with certainty.

In the following, a semiconductor module according to the present embodiment is described with reference to FIGS. 1 to 5.

The semiconductor module according to the present embodiment is provided in wireless communication equipment for which a sub millimeter waveband (terahertz waveband; super-high frequency band) of approximately 300 GHz or more, for example, a sub millimeter waveband of approximately 300 GHz to approximately 3 THz (terahertz waveband from approximately 100 µm to approximately 10 µm), is used. For example, the semiconductor module can be used for super-high-speed short range wireless communication equipment or several 10 Gb/s wireless communication equipment. It is to be noted that the semiconductor module is referred to sometimes as super-high frequency module.

Further, in the present semiconductor module, flip chip mounting is used in which a semiconductor chip is mounted face-down in a reversed relationship on a mounting board such as, for example, a PCB and the signal line and the signal line, the ground and the ground and so forth are coupled with each other using a bump (ball bump; a bump of a ball shape). It is to be noted that the semiconductor chip is referred to sometimes as super-high frequency semiconductor chip.

Figure 1:
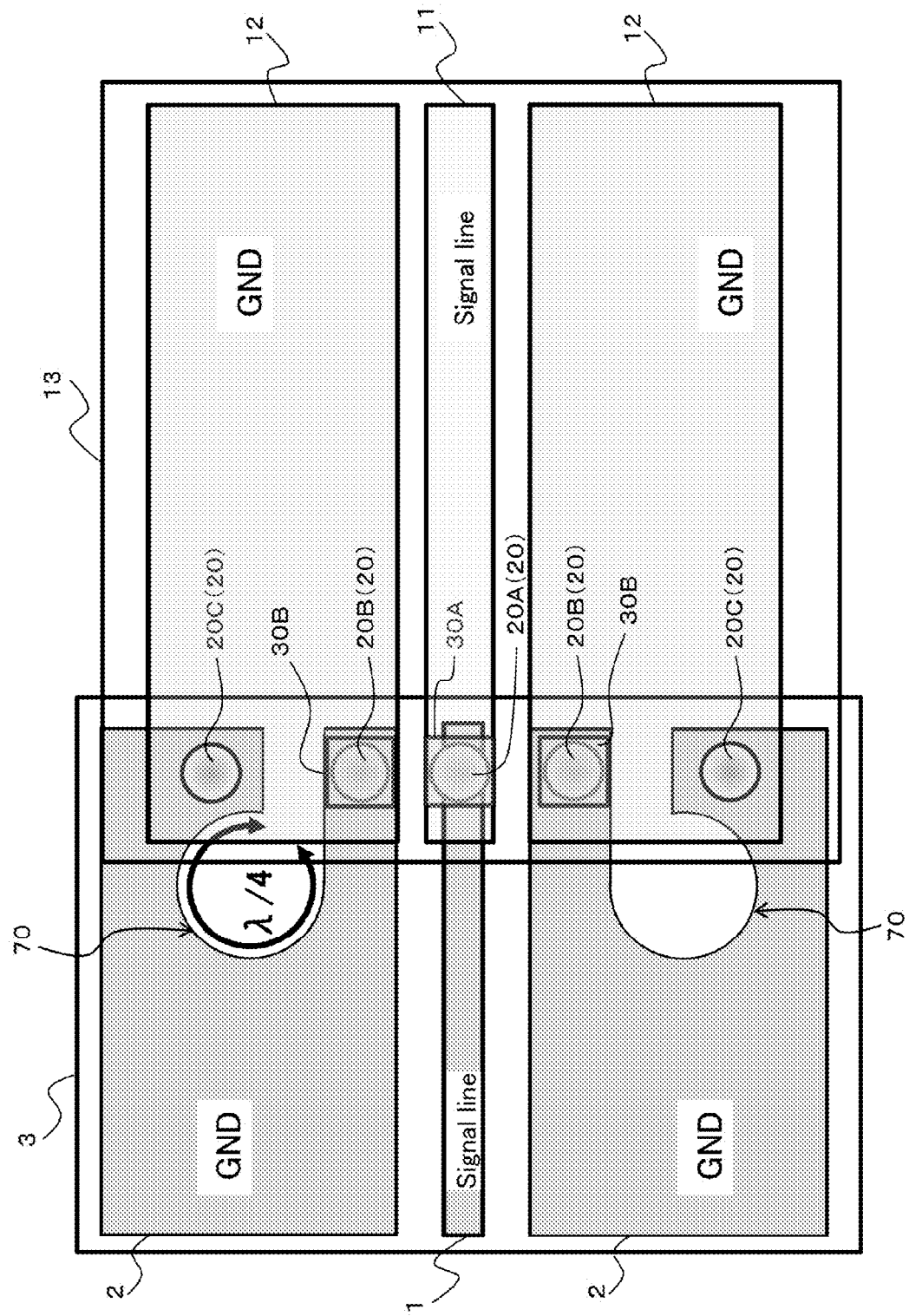
FIG. 1 is a schematic top plan view depicting a configuration of a semiconductor module according to an embodiment.

In the present embodiment, as depicted in FIG. 1, the semiconductor module includes a first semiconductor chip 3 that includes a first signal line 1 and first grounds 2, and a mounting board 13 that includes a second signal line 11 and second grounds 12, and the components are coupled with each other through bumps 20. In particular, the present semiconductor module includes a signal line coupling bump 20A that couples the first signal line 1 and the second signal line 11 with each other, and first ground coupling bumps 20B that couple the first grounds 2 and the second grounds 12 with each other. It is to be noted that each of the signal lines 1 and 11 is referred to sometimes as signal line pattern. Further, each of the grounds 2 and 12 is referred to sometimes as ground pattern.

Here, the first semiconductor chip 3 includes a coplanar transmission line having the ground patterns 2 at both sides thereof across the signal line pattern 1 on a front face thereof. In particular, patterns of one ground 2, the signal line 1 and the other ground 2 are provided in order from one side on the front face of the first semiconductor chip 3, and the coplanar transmission line [GND-Signal-GND (GSG) transmission line] is configured from the patterns. Therefore, the semiconductor chip 3 is referred to sometimes as transmission line chip.

Further, the mounting board 13 includes a coplanar transmission line having the ground patterns 12 at both sides across the signal line pattern 11 on the front face thereof. In particular, patterns of one ground 12, the signal line 11 and the other ground 12 are provided in order from the one side on the front face of the mounting board 13, and the coplanar transmission line [GND-Signal-GND (GSG) transmission line] is configured from the patterns. Therefore, the mounting board 13 is referred to sometimes as transmission line board.

It is to be noted here that, while the present embodiment is described taking a case in which the coplanar transmission line is provided on the overall face of the first semiconductor chip 3 and the mounting board 13 as an example, the provision of the coplanar transmission line is not limited to this. At least a bump coupling portion (interface portion) between the first semiconductor chip 3 and the mounting board 13 may be configured from the coplanar transmission line, and the other portion than the bump coupling portion may be configured from a different transmission line such as, for example, a micro strip line.

Further, the signal line pattern (first signal line) 1 of the coplanar transmission line provided on the first semiconductor chip 3 and the signal line pattern (second signal line) 11 of the coplanar transmission line provided on the mounting board 13 are coupled with each other through the signal line coupling bump 20A. Further, portions at the signal line pattern 1 side of the ground patterns (first ground) 2 provided at both sides of the signal line pattern 1 of the coplanar transmission line provided on the first semiconductor chip 3 and portions at the signal line patterns 11 of the ground patterns (second grounds) 12 provided at both sides of the signal line patterns 11 of the coplanar transmission line provided on the mounting board 13 are coupled with each other through the first ground coupling bumps 20B.

Especially, the present semiconductor module includes a signal line side insulating film 30A having a capacitance that causes a series resonance with an inductance by the signal line coupling bump 20A at a target frequency, and ground side insulating films 30B having a capacitance that causes a series resonance with an inductance by the first ground coupling bumps 20B at a target frequency.

Here, the signal line coupling bump 20A and the first ground coupling bumps 20B are inductors in an equivalent circuit and individually have an inductance. Further, the signal line side insulating film 30A and the ground side insulating films 30B are capacitors in the equivalent circuit and individually have a capacitance.

The value of the capacitance of a capacitor parasitic to the signal line side insulating film 30A is set so as to cause a series resonance with the inductance of an inductor parasitic to the signal line coupling bump 20A at a target frequency.

In particular, the value of the capacitance of the capacitor parasitic to the signal line side insulating film 30A is set so that the target frequency (frequency of a high frequency signal to be transmitted) coincides with a resonance frequency ($f_{LC}=1/2\pi\sqrt{LC}$). Consequently, an interface portion between the first signal line 1 and the second signal line 11 appears as a short circuit to an RF signal by the series resonance (LC series resonance). In particular, the impedance (inductive impedance; inductive reactance) $Z=\omega L$ (here, $\omega=2\pi f$) of the inductor parasitic to the signal line coupling bump 20A is cancelled by the impedance (capacitive impedance; capacitive reactance) $Z=1/\omega C$ (here $\omega=2\pi f$) of the capacitor parasitic to the signal line side insulating film 30A, and the interface portion between the first signal line 1 and the second signal line 11 appears as a short circuit to an RF signal.

Further, the value of the capacitance of a capacitor parasitic to the ground side insulating films 30B is set so as to cause a series resonance with the inductance of an inductor parasitic to the first ground coupling bumps 20B at a target frequency.

In particular, the value of the capacitance of the capacitor parasitic to the ground side insulating films 30B is set so that the target frequency (frequency of a high frequency signal to be transmitted) coincides with a resonance frequency ($f_{LC}=1/2\pi\sqrt{LC}$). Consequently, an interface portion between the first grounds 2 and the second grounds 12 appears as a short circuit to an RF signal by the series resonance (LC series resonance). In particular, the impedance (inductive impedance; inductive reactance) $Z=\omega L$ (here, $\omega=2\pi f$) of the inductor parasitic to the first ground coupling bumps 20B is cancelled by the impedance (capacitive impedance; capacitive reactance) $Z=1/\omega C$ (here $\omega=2\pi f$) of the capacitor parasitic to the ground side insulating films 30B, and an interface portion between the first grounds 2 and the second grounds 12 appears as a short circuit to an RF signal.

Here, the signal line side insulating film 30A is an insulating thin film and is provided in the inside of a pad of the first semiconductor chip 3 on which the signal line coupling bump 20A is provided. Here, signal line metal (metal film) to be configured as the signal line 1 is provided on the front face of the first semiconductor chip 3, and the pad in which the insulating film 30A (dielectric film; signal line side insulating film) and metal (metal film; pad metal) are stacked in order is provided at a portion on the signal line metal at which the pad couples with the signal line 11 on the mounting board 13 through the signal line coupling bump 20A. In particular, the pad of the first semiconductor chip 3 on which the signal line coupling bump 20A is provided has a MIM (Metal-Insulator-Metal) structure in which a metal, an insulating film and another metal are stacked in order and configures a capacitor (capacitance). In particular, the pad of the first semiconductor chip 3 on which the signal line coupling bump 20A is provided includes a capacitor. In this case, the value of the capacitance (capacitance value) of the capacitor parasitic to the signal line side insulating film 30A can be set by the area of the signal line side insulating film 30A.

Figure 2:
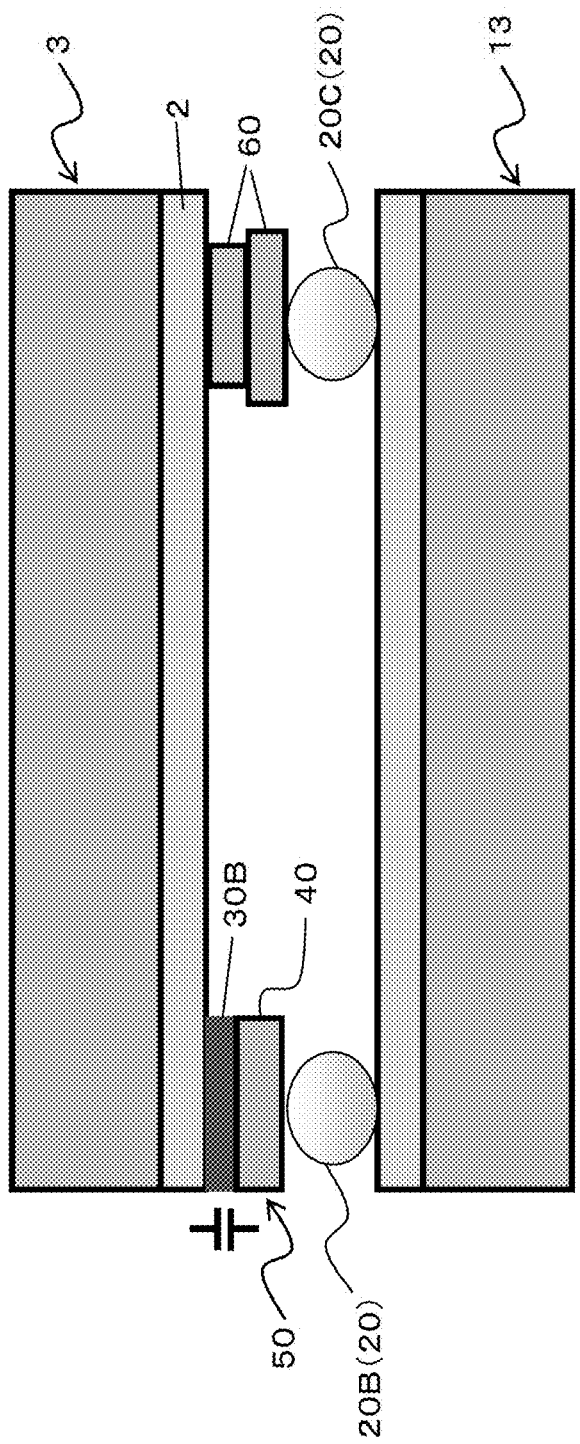
FIG. 2 is a schematic sectional view depicting a configuration of a coupling portion of the semiconductor module according to the present embodiment.

Further, each ground side insulating film 30B is an insulating thin film and is provided in the inside of the pad of the first semiconductor chip 3 on which the first ground coupling bump 20B is provided. Here, as depicted in FIG. 2, ground metal (metal film) used as the ground 2 is provided on the front face of the first semiconductor chip 3, and a pad 50 in which an insulating film 30B (dielectric film; ground side insulating film) and metal 40 (metal film; pad metal) are stacked in order is provided at a portion on the ground metal 2 with which the ground 12 on the mounting board 13 is coupled through the first ground coupling bump 20B. In particular, the pad 50 of the first semiconductor chip 3 on which the first ground coupling bump 20B is provided has a MIM structure in which the metal 2, insulating film 30B and metal 40 are stacked in order and configures a capacitor (capacitance). In other words, the pad 50 of the first semiconductor chip 3 on which the first ground coupling bump 20B is provided includes a capacitor. In this case, the value of the capacitance (capacitance value) of the capacitor parasitic to the ground side insulating film 30B can be set by the area of the ground side insulating film 30B.

In this manner, by providing the signal line side insulating film 30A and the ground side insulating films 30B in the inside of the pad of the first semiconductor chip 3, the insulating films 30A and 30B configuring the capacitors can be provided with high production accuracy in comparison with those in a case in which the insulating films are provided at the mounting board 13 side.

Therefore, in the present semiconductor module, the first signal line 1 of the first semiconductor chip 3 and the second signal line 11 of the mounting board 13 are coupled electrically with each other through the signal line coupling bump 20A and the signal line side insulating film 30A. Further, the signal line coupling bump 20A and the signal line side insulating film 30A are coupled in series with each other between the first signal line 1 of the first semiconductor chip 3 and the second signal line 11 of the mounting board 13.

Figure 3:
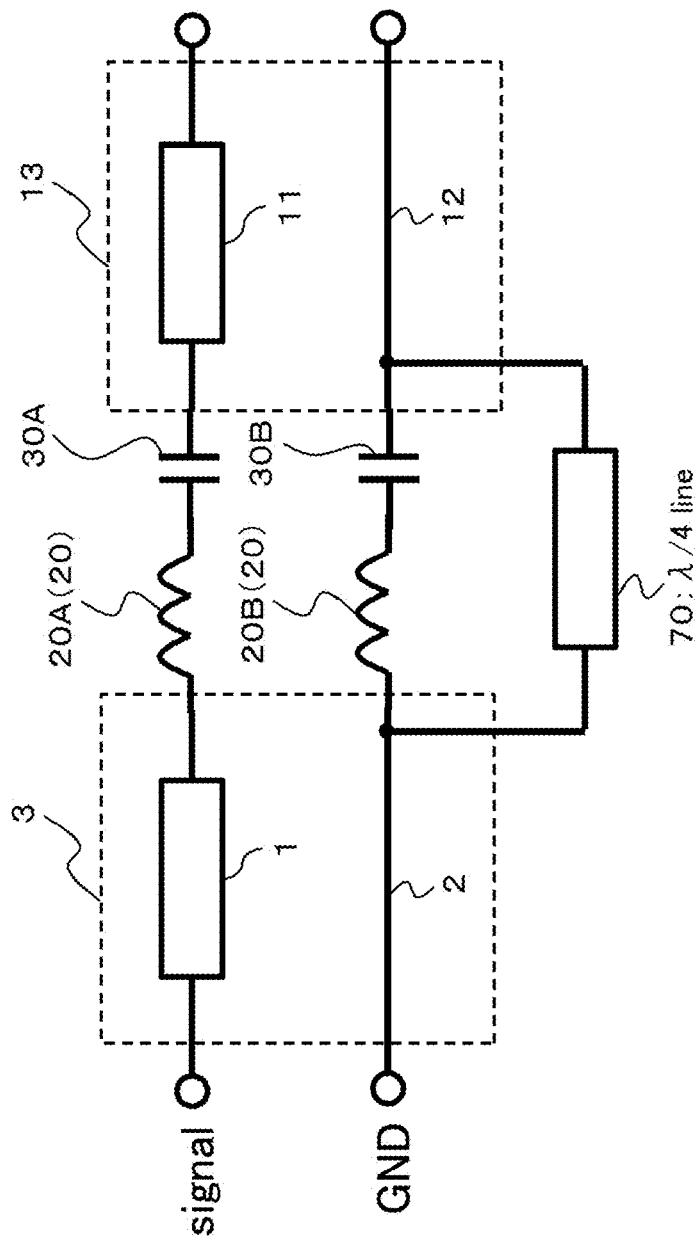
FIG. 3 is a view depicting an equivalent circuit of the semiconductor module according to the present embodiment.

In particular, as depicted in an equivalent circuit diagram of FIG. 3, the first signal line 1 of the first semiconductor chip 3 and the second signal line 11 of the mounting board 13 are coupled electrically with each other through the inductor by the signal line coupling bump 20A and the capacitor by the signal line side insulating film 30A. Further, the inductor by the signal line coupling bump 20A and the capacitor by the signal line side insulating film 30A are coupled in series between the first signal line 1 of the first semiconductor chip 3 and the second signal line 11 of the mounting board 13. In this manner, a series resonance circuit (LC series resonance circuit; signal line side series resonance circuit) of the inductor L and the capacitor C is provided at the coupling portion between the first signal line 1 of the first semiconductor chip 3 and the second signal line 11 of the mounting board 13. In other words, the capacitor C formed by the signal line side insulating film 30A provided in the inside of the pad of the first semiconductor chip 3 on which the signal line coupling bump 20A is provided is coupled in series with the inductor L formed by the bump 20A used for the flip chip mounting so that the series resonance circuit is formed.

Similarly, in the present semiconductor module, each first ground 2 of the first semiconductor chip 3 and each second ground 12 of the mounting board 13 are coupled electrically with each other through a first ground coupling bump 20B and a ground side insulating film 30B. Further, the first ground coupling bump 20B and the ground side insulating film 30B are coupled in series between the first ground 2 of the first semiconductor chip 3 and the second ground 12 of the mounting board 13.

In short, as depicted in the equivalent circuit diagram of FIG. 3, the first ground 2 of the first semiconductor chip 3 and the second ground 12 of the mounting board 13 are coupled electrically with each other through the inductor by the first ground coupling bump 20B and the capacitor by the ground side insulating film 30B. Further, the inductor by the first ground coupling bump 20B and the capacitor by the ground side insulating film 30B are coupled in series between the first ground 2 of the first semiconductor chip 3 and the second ground 12 of the mounting board 13. In this manner, a series resonance circuit (LC series resonance circuit; ground side series resonance circuit) of the inductor L and the capacitor C is provided at the coupling portion between the first ground 2 of the first semiconductor chip 3 and the second ground 12 of the mounting board 13. In short, the capacitor C formed by the ground side insulating film 30B provided in the inside of the pad of the first semiconductor chip 3 on which the first ground coupling bump 20B is provided is coupled in series with the inductor L formed by the bump 20B used for the flip chip mounting so that the series resonance circuit is formed.

In this manner, where the flip chip mounting with which the signal line and the signal line or the ground and the ground are coupled with each other by the bump 20 is used to establish an interface between the signal lines or the grounds, transmission of a high frequency signal in a sub millimeter waveband of approximately 300 GHz or more can be implemented by contriving the configuration of the coupling portion (coupling circuit; coupling pattern). In particular, where the signal line and the signal line or the ground and the ground are coupled with each other by the bump 20, the insulating films 30A and 30B individually having a capacitance are intentionally added, a series resonance circuit is configured and an influence of the inductance parasitic to the bump 20 is removed, thereby increase of the loss arising from increase of the impedance caused by the inductance of the bump 20 is suppressed. Consequently, a high frequency signal in the sub millimeter waveband of approximately 300 GHz or more can be transmitted with certainty without the loss between the first semiconductor chip 3 and the mounting board 13. By providing such a semiconductor module as described above, wireless communication equipment for which the sub millimeter waveband of approximately 300 GHz or more is used can be implemented and the transmission speed of the wireless communication equipment can be increased.

It is to be noted that, while, in the present embodiment, the signal line side insulating film 30A is provided in the inside of the pad of the first semiconductor chip 3 on which the signal line coupling bump 20A is provided and the ground side insulating film 30B is provided in the inside of the pad of the first semiconductor chip 3 on which the first ground coupling bump 20B is provided, the provision of the signal line side insulating film 30A and the ground side insulating film 30B is not limited to this. For example, the signal line side insulating film 30A may be provided in the inside of the pad of the mounting board 13 on which the signal line coupling bump 20A is provided or in the inside of the pad of the first semiconductor chip 3 and the mounting board 13 on which the signal line coupling bump 20A is provided. In this manner, the signal line side insulating film 30A may be provided in the inside of the pad of the first semiconductor chip 3 or the mounting board 13 on which the signal line coupling bump 20A is provided. Further, the ground side insulating film 30B may be provided in the inside of the pad of the mounting board 13 on which the first ground coupling bump 20B is provided or in the inside of the pad of the first semiconductor chip 3 and the mounting board 13 on which the first ground coupling bump 20B is provided. In this manner, the ground side insulating film 30B may be provided in the inside of the pad of the first semiconductor chip 3 or the mounting board 13 on which the first ground coupling bump 20B is provided.

Further, while the present embodiment is described taking a case in which the first semiconductor chip 3 is flip-chip-mounted on the mounting board 13 using the bump 20 as an example, the configuration is not limited to this. For example, the second semiconductor chip may be flip-chip-mounted similarly on the first semiconductor chip using the bump. In this case, the semiconductor module includes a second semiconductor chip including a second signal line and a second ground in place of the mounting board including the second signal line and the ground described above. Further, the signal line side insulating film may be provided in the inside of the pad of the first semiconductor chip on which the signal line coupling bump is provided, in the inside of the pad of the second semiconductor chip on which the signal line coupling bump is provided or in the inside of the pad of the first semiconductor chip and the second semiconductor chip on which the signal line coupling bump is provided. In this manner, the signal line side insulating film may be provided in the inside of the pad of the first semiconductor chip or the second semiconductor chip on which the signal line coupling bump is provided. Further, the ground side insulating film may be provided in the inside of the pad of the first semiconductor chip on which the first ground coupling bump is provided, in the inside of the pad of the second semiconductor chip on which the first ground coupling bump is provided or in the inside of the pad of the first semiconductor chip and the second semiconductor chip on which the first ground coupling bump is provided. In this manner, the ground side insulating film may be provided in the inside of the pad of the first semiconductor chip or the second semiconductor chip on which the first ground coupling bump is provided. It is to be noted that each of the first and second semiconductor chips is referred to sometimes as super-high frequency semiconductor chip.

Incidentally, if the ground side insulating film 30B configuring a capacitor is provided at a portion at which the first ground 2 of the first semiconductor chip 3 and the second ground 12 of the mounting board 13 are coupled with each other (here, at a portion of the inside of the pad of the first semiconductor chip 3 on which the first ground coupling bump 20B is provided) described above, then the coupling between the grounds fully appears as an open circuit to a DC signal.

In this case, there is the possibility that a high voltage may be applied across the ground side insulating film 30B, for example, by static electricity, and as a result, there is the possibility that the ground side insulating film 30B may be broken. Further, where the second semiconductor chip is flip-chip-mounted on the first semiconductor chip using a bump and the first and second semiconductor chips include a circuit to apply a voltage such as, for example, an amplifier, if the grounds are separated from each other between the chips, then a voltage reference for the chips is lost and a correct voltage cannot be applied. In particular, if an element such as, for example, a filter circuit for passing only a specific frequency therethrough is used, then signal transmission can be achieved even if the coupling between the grounds appears as an open circuit to a DC signal. However, where the first and second semiconductor chips include a circuit to apply a voltage such as, for example, an amplifier, there is the possibility that, if the coupling between the grounds appears as an open circuit to a DC signal, then signal transmission may be disabled.

Therefore, in the present embodiment, as depicted in FIG. 1, the semiconductor module further includes a second ground coupling bump 20C that couples each first ground 2 of the first semiconductor chip 3 and each second ground 12 of the mounting board 13 with each other and is coupled with each first ground coupling bump 20B through a λ/4 line having a length of ¼ the signal wavelength (wavelength of a signal to be transmitted; wavelength of a transmission signal) λ.

In other words, the first grounds 2 of the first semiconductor chip 3 and the second grounds 12 of the mounting board 13 are coupled with each other by the first ground coupling bumps 20B, and are further coupled by the second ground coupling bumps 20C coupled in parallel to the first ground coupling bumps 20B.

Here, the second ground coupling bumps 20C are provided at positions spaced from the signal line coupling bump 20A with respect to the first ground coupling bumps 20B. In particular, the first ground coupling bumps 20B are provided in the proximity of the signal line coupling bump 20A, and the second ground coupling bumps 20C are provided at positions spaced from the signal line coupling bump 20A with respect to the first ground coupling bumps 20B.

In the present embodiment, as described above, the first semiconductor chip 3 and the mounting board 13 individually include a coplanar transmission line having the grounds 2 and 12 at both sides thereof across the signal line. In particular, in the first semiconductor chip 3 and the mounting board 13, grounds 2 and 12, the signal lines 1 and 11 and the other grounds 2 and 12 are provided in order from one side, and the coplanar transmission line is configured from the components.

Therefore, the signal line coupling bump 20A to couple the signal line and the signal line with each other is positioned at the center and the first ground coupling bumps 20B to couple the ground and the ground in the proximity of the signal line are positioned at both sides in the proximity of the bump 20A while the second ground coupling bumps 20C to couple the ground and the ground at positions spaced from the signal line are positioned at the outer side. In short, a second ground coupling bump 20C, a first ground coupling bump 20B, the signal line coupling bump 20A, the other first ground coupling bump 20B and the other second ground coupling bump 20C are provided in order from one side.

Further, in the present embodiment, as described above, the insulating film (signal line side insulating film) 30A configuring a capacitor is provided in the inside of the pad of the first semiconductor chip 3 on which the signal line coupling bump 20A is provided, and each insulating film (ground side insulating film) 30B configuring a capacitor is provided in the inside of a pad of the first semiconductor chip 3 on which the first ground coupling bump 20B is provided. On the other hand, an insulating film is not provided in the inside of the pads of the first semiconductor chip 3 on which the second ground coupling bumps 20C are provided. In particular, the pad of the first semiconductor chip 3 on which a second ground coupling bump 20C is provided is structured such that metal 60 is stacked on the ground metal 2 as depicted in FIG. 2, and an insulating film is not provided. Therefore, the pads of the first semiconductor chip 3 on which the second ground coupling bumps 20C are provided do not include a capacitor.

Therefore, in the first semiconductor chip 3, the pad in the inside of which an insulating film is not provided, pad in the inside of which the insulating film (ground side insulating film) 30B is provided, pad in the inside of which the insulating film (signal line side insulating film) 30A is provided, pad in the inside of which the insulating film (ground side insulating film) 30B is provided and pad in the inside of which an insulating film is not provided are provided in order from the one side. In short, in the first semiconductor chip 3, the ground pad that does not include a capacitor, ground pad including a capacitor, signal line pad including a capacitor, ground pad including a capacitor and the ground pad that does not include a capacitor are provided in order from the one side.

Further, as depicted in FIG. 1, the first ground coupling bumps 20B and the second ground coupling bumps 20C are individually coupled with each other through a λ/4 line 70. In particular, the first ground coupling bumps 20B and the second ground coupling bumps 20C are separated from each other such that the electric length between the bumps 20B and 20C is ¼ the wavelength of the transmission signal. It is to be noted that the λ/4 lines 70 may be configured so as to have a length of ¼ time the wavelength of the transmission signal. In other words, the first ground coupling bumps 20B and the second ground coupling bumps 20C may be provided separately from each other such that the electric length between the bumps 20B and 20C is ¼ time the wavelength of the transmission signal.

Further, while each ground side insulating film 30B configuring a capacitor is provided at the portion coupled by a first ground coupling bump 20B as described above, an insulating film configuring a capacitor is not provided at the portion coupled by a second ground coupling bump 20C.

Therefore, a short stab configured from each λ/4 line 70 whose tip end is coupled with the second ground coupling bump 20C and configures a short circuit is coupled with the ground side series resonance circuit configured from the first ground coupling bump 20B and the ground side insulating film 30B. In this case, the equivalent circuit is configured as depicted in FIG. 3, and the λ/4 line 70 is coupled in parallel to the ground side series resonance circuit coupled between the first ground 2 of the first semiconductor chip 3 and the second ground 12 of the mounting board 13.

In this case, the first ground 2 of the first semiconductor chip 3 and the second ground 12 of the mounting board 13 are coupled through the first ground coupling bumps 20B and the ground side insulating films 30B (series resonance circuit) so as to appear as a short circuit to an RF signal and appear as an open circuit to a DC signal, and are coupled through the second ground coupling bumps 20C coupled with the first ground coupling bumps 20B through the λ/4 lines 70 so as to appear as a short circuit to a DC signal and appear as an open circuit to an RF signal.

Figure 4:
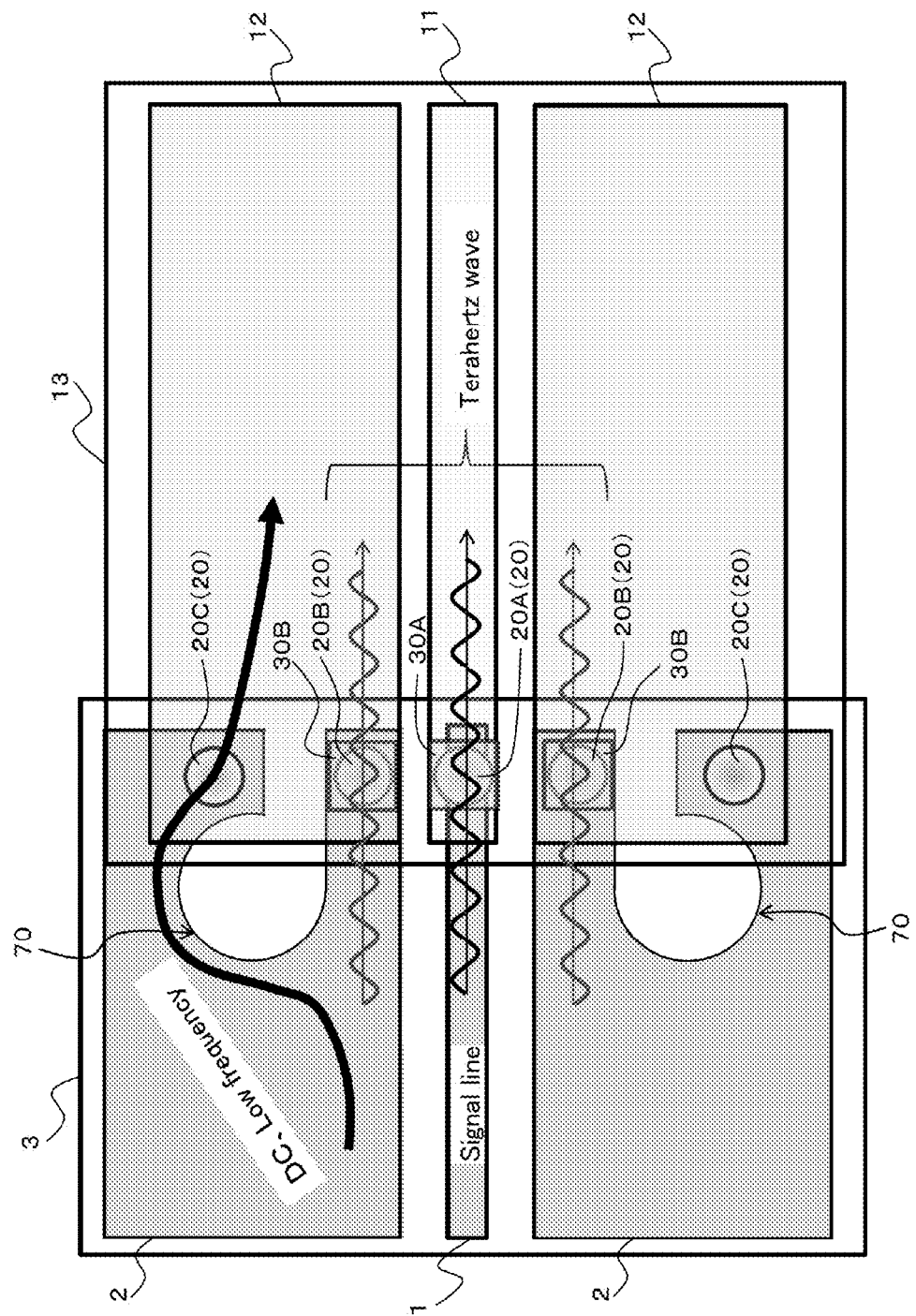
FIG. 4 is a schematic view illustrating signal transmission and flow of direct current in the semiconductor module according to the present embodiment.

Consequently, as depicted in FIG. 4, between the first semiconductor chip 3 and the mounting board 13, a high frequency signal of the sub millimeter waveband of approximately 300 GHz or more is propagated (transmitted) through the signal line coupling bump 20A and the first ground coupling bumps 20B provided in the proximity of the bump 20A, and direct current and a signal having a low frequency (low frequency signal) are propagated through the second ground coupling bumps 20C coupled with the outer side of the first ground coupling bumps 20B through the λ/4 lines 70.

By configuring the semiconductor module so that direct current flows through the second ground coupling bumps 20C in this manner, such a situation that a high voltage (high DC voltage) is applied, for example, by static electricity, across the ground side insulating films 30B provided between the first ground 2 of the first semiconductor chip 3 and the second ground 12 of the mounting board 13 can be prevented. Consequently, such a situation that the ground side insulating film 30B is broken can be prevented. Further, for example, where the second semiconductor chip is flip-chip-mounted on the first semiconductor chip using a bump and the first and second semiconductor chips include a circuit to apply a voltage such as, for example, an amplifier, the semiconductor module can be configured such that the grounds are not separated between the chips, and a voltage reference for the chips can be secured and a correct voltage can be applied. In other words, where the first and second semiconductor chips include a circuit to apply a voltage such as, for example, an amplifier, such a situation can be prevented that coupling between the grounds appears as an open circuit to a DC signal, and signal transmission can be achieved with certainty.

In the present embodiment, as depicted in FIG. 1, each $\lambda/4$ line 70 is formed by setting the length in a peripheral direction of a portion thereof removed in a circular shape of the first ground 2 of the first semiconductor chip 3 to $\lambda/4$. In particular, in order to form the $\lambda/4$ line 70 on a ground pattern configuring the first ground 2 of the first semiconductor chip 3, the ground pattern (ground metal) is removed in a circular shape and the circular length of the removed portion is set to $\lambda/4$ so as to form the $\lambda/4$ line 70. By configuring the pattern for forming the $\lambda/4$ line 70 in a circular shape in this manner, such a situation is reduced that loss occurs with a high frequency signal, and a good high frequency characteristic is obtained. In particular, if the pattern for forming the $\lambda/4$ line 70 is formed otherwise in an elongated slit shape, then a high frequency signal (RF signal) is radiated spatially through the slit and some loss occurs. Therefore, by configuring the pattern for forming the $\lambda/4$ line 70 in a circular shape, spatial radiation and occurrence of some loss are reduced, and a good high frequency characteristic is obtained.

It is to be noted that, in order to reduce spatial radiation and occurrence of some loss and obtain a good high frequency characteristic, the pattern for forming the $\lambda/4$ line 70 may be formed in a shape other than a slit shape, and therefore, the shape of the pattern is not limited to the slit shape and may be, for example, a polygonal shape. In other words, the $\lambda/4$ line may be formed by setting the length in a peripheral direction of a portion removed in a polygonal shape of the first ground of the first semiconductor chip to $\lambda/4$.

Further, while the $\lambda/4$ line 70 here is provided on the first ground 2 of the first semiconductor chip 3, the configuration is not limited to this, and the $\lambda/4$ line 70 may be provided on each second ground 12 of the mounting board 13 or the second ground of the second semiconductor chip. In other words, the $\lambda/4$ line may be formed by setting the length in a peripheral direction of a portion removed in a circular shape or a polygonal shape of the first ground or the second ground to $\lambda/4$.

Accordingly, with the semiconductor module according to the present embodiment, there is an advantage that it is reduced that loss increases by increase of the impedance arising from the inductance of the bumps 10 where the signal line 1 and the signal line 11 or the ground 1 and the ground 12 are coupled with each other through the bumps 20 and a high frequency signal can be transmitted with certainty.

Figure 5:
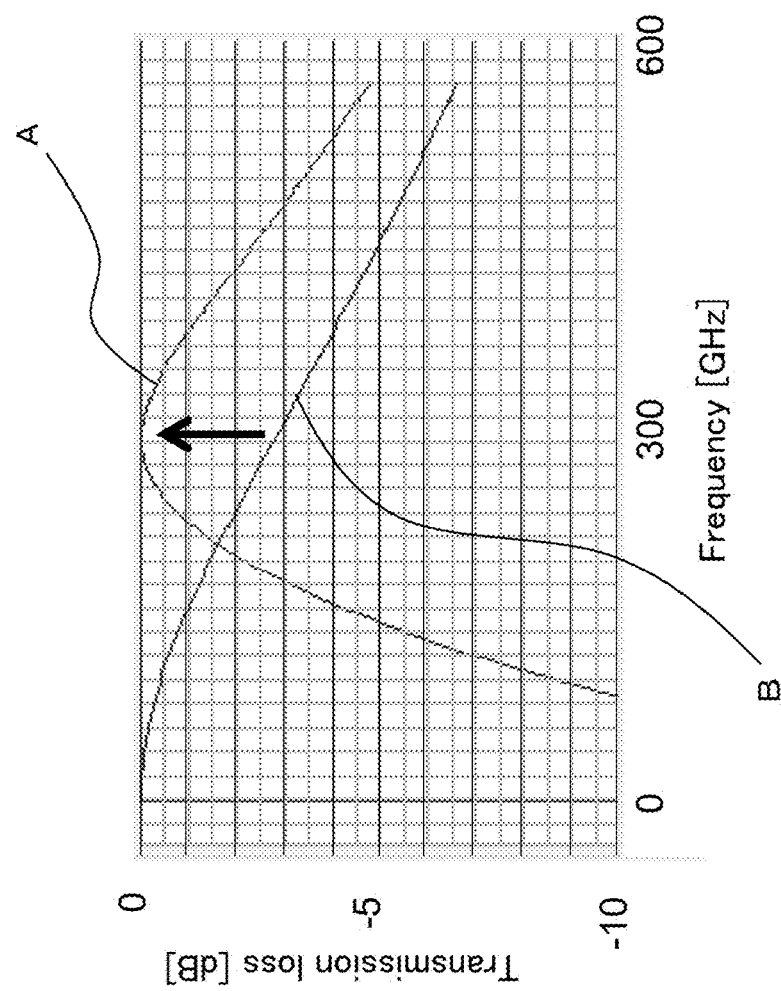
FIG. 5 is a view illustrating an effect by the semiconductor module according to the present embodiment.
Figure 6:
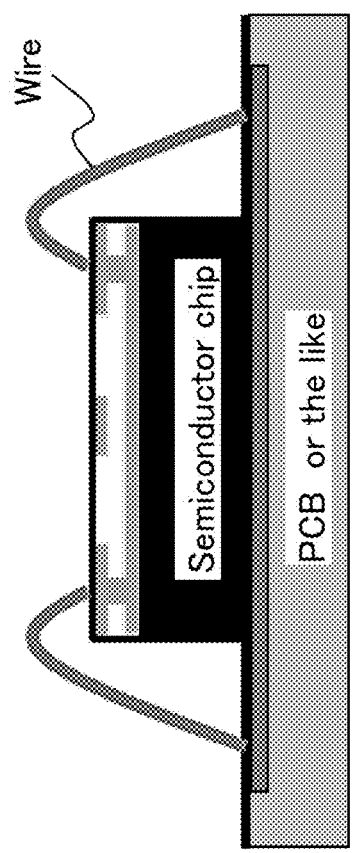
FIG. 6 is a schematic view depicting a wire-bonding mounted semiconductor module.
Figure 7:
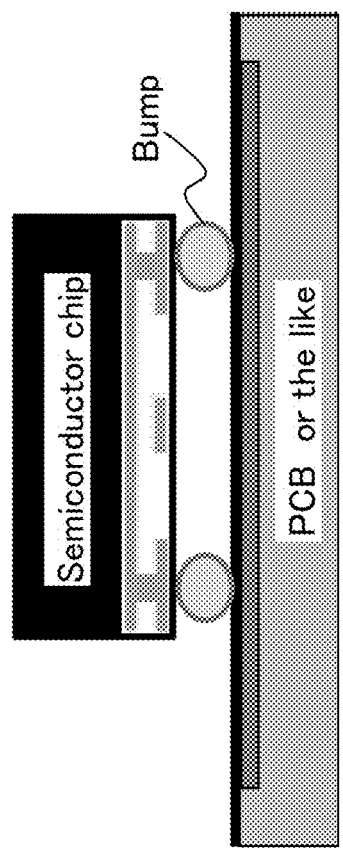
FIG. 7 is a schematic view depicting a semiconductor module flip-chip mounted only by a bump.

Here, FIG. 5 illustrates that transmission loss of the semiconductor module configured in such a manner as in the embodiment described above (propagation loss at an interface portion) is plotted with respect to the frequency. It is to be noted that, in FIG. 5, the axis of ordinate and the axis of abscissa indicate the transmission loss and the frequency, respectively. Further, a curve obtained by plotting the transmission loss of the semiconductor module configured in such a manner as in the embodiment described above with respect to the frequency is indicated by a solid line A. Further, in FIG. 5, for comparison, also transmission loss of the semiconductor module flip-chip-coupled only by a bump without providing an insulating film is plotted with respect to the frequency. Further, a curve obtained by plotting transmission loss of the semiconductor module flip-chip-coupled only by a bump without providing an insulating film with respect to the frequency is indicated by a solid line B.

As indicated by the solid line B in FIG. 5, it is recognized that, in the semiconductor module flip-chip-coupled by a bump without providing an insulating film, the transmission loss increases monotonously as the frequency increases. Further, the transmission loss of a high frequency signal of the sub millimeter waveband of approximately 300 GHz that is a target frequency is approximately 3 dB. In contrast, as indicated by the solid line A in FIG. 5, in the semiconductor module configured in such a manner as in the embodiment described above, the transmission loss of a high frequency signal of the sub millimeter waveband of approximately 300 GHz that is a target frequency is substantially zero.

In this manner, it is recognized that the transmission loss is improved by approximately 3 dB by applying the semiconductor module configured in such a manner as in the embodiment described above to the semiconductor module flip-chip-coupled only by a bump without providing an insulating film. This signifies that the signal intensity is improved by twice. Consequently, by applying the semiconductor module configured in such a manner as in the embodiment described above, a high frequency signal of the sub millimeter waveband of approximately 300 GHz that is a target frequency can be transmitted without loss.

All examples and conditional language recited herein are intended for the pedagogical purposes of aiding the reader in understanding the disclosure and the concepts contributed by the inventor to further the art, and are not to be construed as limitations to such specifically recited examples and conditions, nor does the organization of such examples in the specification relate to a showing of the superiority and inferiority of the disclosure. Although one or more embodiments of the present disclosures have been described in detail, it should be understood that the various changes, substitutions, and alterations could be made hereto without departing from the spirit and scope of the disclosure.

What is claimed is:

1. A semiconductor module, comprising:
   a first semiconductor chip including a first signal line and a first ground;
   a mounting board or a second semiconductor chip including a second signal line and a second ground;
   a signal line coupling bump that couples the first signal line and the second signal line with each other;
   a first ground coupling bump that couples the first ground and the second ground with each other;
   a signal line side insulating film including a capacitance that causes a series resonance with an inductance by the signal line coupling bump at a target frequency;

a ground side insulating film including a capacitance that causes a series resonance with an inductance by the first ground coupling bump at a target frequency; and a second ground coupling bump that couples the first ground and the second ground with each other and besides is coupled with the first ground coupling bump through a $\lambda/4$ line having a length equal to $1/4$ of a signal wavelength $\lambda$.

2. The semiconductor module according to claim 1, wherein the signal line side insulating film is provided in the inside of a pad of the first semiconductor chip on which the signal line coupling bump is provided; and the ground side insulating film is provided in the inside of a pad of the first semiconductor chip on which the first ground coupling bump is provided.

3. The semiconductor module according to claim 1, wherein the signal line side insulating film is provided in the inside of a pad of the mounting board on which the signal line coupling bump is provided; and the ground side insulating film is provided in the inside of a pad of the mounting board on which the first ground coupling bump is provided.

4. The semiconductor module according to claim 1, wherein the signal line side insulating film is provided in the inside of a pad of the second semiconductor chip on which the signal line coupling bump is provided; and the ground side insulating film is provided in the inside of a pad of the second semiconductor chip on which the first ground coupling bump is provided.

5. The semiconductor module according to claim 1, wherein the $\lambda/4$ line is formed by setting the length in a peripheral direction of a portion of the first ground or the second ground removed in a circular shape or polygonal shape to $\lambda/4$.

6. The semiconductor module according to claim 1, wherein the second ground coupling bump is provided at a position spaced from the signal line coupling bump with respect to the first ground coupling bump.

* * * * *